(12) United States Patent
Saito (10) Patent No.: US 10,123,454 B2
(45) Date of Patent: Nov. 6, 2018

(54) ELECTRONIC-DEVICE COOLING SYSTEM

(71) Applicant: ExaScaler Inc., Chiyoda-ku, Tokyo (JP)

(72) Inventor: Motoaki Saito, Tokyo (JP)

(73) Assignee: EXASCALER INC., Tokyo (JP)

( * ) Notice: Subject to any disclaimer, the term of this patent is extended or adjusted under 35 U.S.C. 154(b) by 0 days.

(21) Appl. No.: 15/563,428

(22) PCT Filed: Mar. 30, 2015

(86) PCT No.: PCT/JP2015/060031
§ 371 (c)(1),
(2) Date: Sep. 29, 2017

(87) PCT Pub. No.: WO2016/157396
PCT Pub. Date: Oct. 6, 2016

(65) Prior Publication Data
US 2018/0092243 A1  Mar. 29, 2018

(51) Int. Cl.
*H05K 7/20* (2006.01)
*G06F 1/20* (2006.01)
*H01L 23/473* (2006.01)

(52) U.S. Cl.
CPC .......... *H05K 7/20236* (2013.01); *G06F 1/20* (2013.01); *G06F 1/206* (2013.01); *H01L 23/473* (2013.01); *H05K 7/20* (2013.01); *H05K 7/20263* (2013.01)

(58) Field of Classification Search
CPC .......... H05K 7/20236; H05K 7/20263; H01L 23/473; H01L 23/34; F28C 3/04; F25B 9/00; G06F 1/20
See application file for complete search history.

(56) References Cited

U.S. PATENT DOCUMENTS 3,406,244 A * 10/1968 Oktay .................. F28C 3/04
                                                   165/104.13
4,590,538 A *  5/1986 Cray, Jr. ........... H05K 7/20236
                                                        361/700

(Continued)

FOREIGN PATENT DOCUMENTS

JP        61054654 A  *  3/1986  ........... H01L 23/427
JP      H04207098 A      7/1992

(Continued)

OTHER PUBLICATIONS

International Search Report and Written Opinion for related PCT application No. PCT/JP2015/060031 dated May 12, 2015.

(Continued)

*Primary Examiner* — David M Sinclair
*Assistant Examiner* — Robert Brown
(74) *Attorney, Agent, or Firm* — Procopio, Cory, Hargreaves & Savitch LLP (57) ABSTRACT

Provided is a cooling system capable of improving the cooling performance of an electronic device and being simple and efficient. The cooling system has a cooling tank, and the cooling tank contains in its open space a second cooling liquid having a boiling point $T_2$. An electronic device mounting a processor as a heating element on a board is stored within the open space of the cooling tank and is immersed in the second cooling liquid. A boiling cooling device is a cooling device thermally connected to the processor and encloses a first cooling liquid having a boiling point $T_1$ (provided $T_1=T_2$ or $T_1<T_2$). A first heat exchanger is immersed in a surface layer portion of the second cooling liquid within the cooling tank. The first heat exchanger encloses therein a third refrigerant having a boiling point $T_3$ (provided $T_1=T_3$ or $T_1>T_3$).

9 Claims, 7 Drawing Sheets

(56) References Cited

U.S. PATENT DOCUMENTS

| | | | | |
|---|---|---|---|---|
| 5,349,499 | A * | 9/1994 | Yamada | H01L 23/427 |
| | | | | 165/104.33 |
| 5,524,441 | A * | 6/1996 | Herrmann | H01R 4/68 |
| | | | | 505/892 |
| 6,107,905 | A * | 8/2000 | Itoh | F17C 3/085 |
| | | | | 335/216 |
| 6,758,593 | B1 * | 7/2004 | Terentiev | A61M 1/127 |
| | | | | 366/273 |
| 7,547,385 | B2 * | 6/2009 | Egan | B01F 5/0615 |
| | | | | 208/15 |
| 2010/0290190 | A1 * | 11/2010 | Chester | H05K 7/20772 |
| | | | | 361/701 |
| 2017/0038123 | A1 * | 2/2017 | Strickland | F25D 19/00 |
| 2017/0311479 | A1 * | 10/2017 | Barragy | H05K 7/1488 |

FOREIGN PATENT DOCUMENTS

| | | | |
|---|---|---|---|
| JP | 2002181427 | A | 6/2002 |
| JP | 2002295983 | A | 10/2002 |
| JP | 2007109695 | A | 4/2007 |
| JP | 2008025858 | A * | 2/2008 |
| JP | 2012527109 | A | 11/2012 |
| JP | 2013007501 | A | 1/2013 |
| JP | 2013069740 | A | 4/2013 |
| JP | 2013187251 | A | 9/2013 |

OTHER PUBLICATIONS

Research and Development Project for Green Network/System Technology "Development of Heat-Concentrating Cooling System Using Boiling Heat Transfer" (five-year term from fiscal year 2008 to fiscal year 2012) 8 to 9, 11 pages, Jul. 17, 2013.
International Preliminary Report on Patentability for related PCT application No. PCT/JP2015/060031 dated Oct. 3, 2017.
Decision to Grant for related Japanese application No. 2016-507718 dated May 18, 2016. English translation provided; 6 pages.

* cited by examiner

ELECTRONIC-DEVICE COOLING SYSTEM

CROSS-REFERENCE TO RELATED APPLICATIONS

This application is a U.S. National Stage entry of PCT Application No. PCT/JP2015/060031, filed on Mar. 30, 2015, the contents of which are incorporated herein by reference.

TECHNICAL FIELD

The present invention relates to an electronic device cooling system and particularly, to an electronic device cooling system for efficiently cooling electronic devices such as super computers, data centers and the like that require ultra-high performance operations and stable operations and that have large amounts of heat generated from themselves.

BACKGROUND ART

One of the biggest problems that determine the limitation in performance of supercomputers in recent years is power consumption, and the importance of researches relating to the power-saving capability of supercomputers has already been recognized widely. That is, the speed performance per consumed power (Flops/W) has become one barometer for evaluating the supercomputers. Further, in data centers, it is understood that 45% or so of the power consumption by the whole data centers are consumed for cooling, and therefore, a demand for reduction of the power consumption through improvements in cooling efficiency has become strong.

Heretofore, an air-cooling type and a liquid-cooling type have been in use for cooling supercomputers and data centers. The liquid-cooling type is generally recognized to be high in cooling efficiency because of using a liquid that is remarkably superior to air in heat transfer performance. For example, the "TSUBAME-KFC" built by Tokyo Institute of Technology achieved 4.50G Flops/W by a liquid immersion cooling system using a synthetic oil and acquired the first place in "Supercomputer Green 500 List" announced on Nov. 2013 and Jun. 2014. However, because the synthetic oil being high in viscosity is used as the cooling liquid, it is difficult to completely remove, from electronic devices taken out from oil-immersed racks, the oil adhered thereto, and this gives rise to a problem that the maintenance (specifically, adjustment, inspection, repair, replacement and expansion, for example; the same applies hereafter) of the electronic devices is extremely difficult. Furthermore, the occurrence of a problem has also been reported that causes a difficulty to arise in practical use because the synthetic oil in use leaks by corroding a gasket and the like constituting the cooling system in a short period of time.

On the other hand, there has been proposed a liquid immersion cooling system that uses not the synthetic oil causing the aforementioned problems but a cooling liquid of fluorocarbon-base. Specifically, it is an example that uses a cooling liquid of the fluorocarbon-base (a hydrofluoroether (HFE) compound known as "Novec (trademark of 3M Company; the same applies hereafter) 7100", "Novec 7200" and "Novec 7300", brand names of 3M Company) (Patent Literature 1 and Patent Literature 2, for example).

By the way, in order to locally cool a heating element such as a CPU that generates heat of a particularly large amount, a number of proposals have been made regarding the examples of cooling systems using a boiling cooling device that performs heat transfer and radiation through the cycle of vaporization and condensation of a cooling liquid. One is an example of a cooling module wherein a vaporization section connected to a heating surface of a processor and a condensation section connected to a cooling fan or a water cooling pipe are connected through two pipes to perform refrigerant circulation utilizing vapor-liquid equilibrium (Non Patent Literature 1). Another is an example wherein a cooling liquid is enclosed in a tabular receptacle with a special flow passage wall defined inside, wherein a heat receiving region of the tabular receptacle is thermally connected to a heating element while a heat radiation region of the tabular receptacle is connected to a heat radiation section such as a radiating fin or the like, and wherein the heat radiation region defines a flow passage for a cooling liquid in the heat radiation region (Patent Literature 3, for example).

CITATION LIST

Patent Literature

Patent Literature 1: Japanese Patent Application Laid-Open No. 2013-187251
Patent Literature 2: Japanese Unexamined Patent Application Publication (Translation of PCT Application) No. 2012-527109
Patent Literature 3: Japanese Patent Application Laid-Open No. 2013-69740
Non-Patent Literature 1: Research and Development Project for Green Network/System Technology "Development of Heat-Concentrating Cooling System Using Boiling Heat Transfer" (five-year term from fiscal year 2008 to fiscal year 2012) 8 to 9, 11 pages, Jul. 17, 2013 URL: http://www.nedo.go.jp/content/100532511.pdf

SUMMARY OF INVENTION

Technical Problem

The cooling system disclosed in Patent Literature 1 uses a fluorocarbon-base cooling liquid of being 100° C. or lower in boiling point because of utilizing vaporization heat (latent heat) for the cooling of electronic devices. Then, by utilizing the vaporization heat (latent heat) when the cooling liquid is vaporized by the heat generation on elements mounted on the electronic device, the system deprives the elements of heat to cool the elements. Therefore, because it may occur that on the surfaces of the elements being high in temperature, the fluorocarbon-base cooling liquid locally boils to make the resultant bubbles form thermal insulation films, there arises a problem in that the high heat conduction capability possessed inherently by the cooling liquid is spoiled. Further, electronic devices used in recent supercomputers, data centers and the like include a plurality of objects to be cooled such as a GPU (Graphics Processing Unit), a high speed memory, a chip set, a network unit, a PCI Express bus, a bus switching unit, an SSD (Solid State Drive), power units (an ac-dc converter, a dc-dc voltage converter, etc.) and the like in addition, to a CPU (Central Processing Unit). Thus, it is difficult to equally cool all of these objects which differ in vaporization temperature, so that cooling efficiency becomes very low on the objects in which refrigerant on the surfaces does not vaporize.

Further, the cooling system disclosed in Patent Literature 2 takes the configuration of a sealed module containing one or more heating electronic devices. Thus, because a mechanism for making a cooling liquid flow to pass through individual sealed modules becomes complicated as a whole and because it is unable to easily take the whole of electronic devices out from the sealed module, there arises a problem in that the maintainability of the electronic devices is inferior.

The cooling module proposed by the Research and Development Project for Green Network/System Technology is required to separately provide two pipes which connect a boiling module on a processor to a condensation module disposed at a place being remote therefrom, and thus, gives rise to a problem that the entire construction of the cooling module becomes large in scale and complicated. In addition, the existence of these pipes becomes a hindrance in cooling peripheral electronic components which should depend on air cooling, and in the secondary cooling using a cooling fan or a pipe, cooling efficiency is restricted to be low due to the restriction in the flow quantity in the pipe particularly when such pipe is used. Thus, there arises a problem in that cooling performance in the whole of the electronic device is restricted. On the other hand, although being advantageous because of being able to provide a boiling cooling device of a small-scale for use in a primary cooling for a limited part, a cooling system disclosed in the Patent Literature 3 gives rise to a problem that the cooling performance of the whole of the electronic device cannot be improved by the application of a secondary cooling technology in the prior art being low in cooling efficiency.

As aforementioned, the liquid immersion cooling device in the prior art involves a problem that the entire mechanism for enabling cooling liquid to flow through the sealed module becomes complicated and is inferior in the maintainability of the electronic devices. Further, the boiling cooling device in the prior art is suitable to the local cooling of the electronic device, but involves a problem that the mechanism is liable to become large in scale and complicated as a whole and that the cooling performance of the whole of the electronic device cannot be improved because the cooling efficiency in secondary cooling is low.

Accordingly, an object of the present invention is to provide a cooling system capable of solving the problems of the foregoing prior art, of improving the cooling performance of an electronic device and of being simple and efficient.

Solution to Problem

In order to solve the foregoing problems, according to one aspect of the present invention, there is provided a cooling system for directly cooling an electronic device through immersion in a cooling liquid, and the cooling system comprises a boiling cooling device connected thermally to at least one heating element possessed by the electronic device and enclosing a first cooling liquid having a boiling point $T_1$, a cooling tank containing a second cooling liquid having a boiling point $T_2$ ($T_2=T_1$ or $T_2>T_1$) being the same as the boiling point $T_1$ of the first cooling liquid or being higher than the boiling point $T_1$ of the first cooling liquid wherein the boiling cooling device and the electronic device are immersed in the second cooling liquid to be cooled directly, and a first heat exchanger enclosing a third refrigerant having a boiling point $T_3$ ($T_3=T_3$ or $T_3<T_1$) being the same as the boiling point $T_1$ of the first cooling liquid or being lower than the boiling point $T_1$ of the first cooling liquid and immersed in a surface layer portion of the second cooling liquid in the cooling tank.

In a preferred embodiment of the cooling system according to the present invention, the boiling cooling device may include a sealed container having a heat receiving side and a hear radiation side and a heat radiating member provided on the heat radiation side, and when the boiling cooling device and the electronic device are immersed in the second cooling liquid, the thermal connection to the heating element may be configured to locate the heat radiation side higher than the heat receiving side.

Further, in the preferred embodiment of the cooling system according to the present invention, a configuration may be taken that the boiling point of the first cooling liquid is 100° C. or lower, that the boiling point of the second cooling liquid is 150° C. or higher, and that the boiling point of the third refrigerant is 50° C. or lower.

Furthermore, in the preferred embodiment of the cooling system according to the present invention, a configuration may be taken that the first cooling liquid and/or the third refrigerant includes a fluorocarbon compound as a main component.

Further, in the preferred embodiment of the cooling system according to the present invention, a configuration may be taken that the second cooling liquid includes perfluoride as a main component.

Furthermore, in the preferred embodiment of the cooling system according to the present invention, the cooling system is further provided with a second heat exchanger disposed outside the cooling tank for cooling the third refrigerant, and the first heat exchanger and the second heat exchanger may be connected through a first flow passage.

Further, in the preferred embodiment of the cooling system according to the present invention, the cooling tank may include a top board attached to an upper opening of the cooling tank to be detachable or to be openable and closable, and the top board may hold the first heat exchanger.

Furthermore, in the preferred embodiment of the cooling system according to the present invention, the cooling tank may have an inlet and an outlet for the second cooling liquid, the inlet and the outlet may be connected through a second flow passage being outside the cooling tank, and the flow passage maybe provided with at least one pump for moving the second cooling liquid and a third heat exchanger for cooling the second cooling liquid.

Additionally, according to another aspect of the present invention, there is provided a cooling system for directly cooling a plurality of electronic devices through immersion in a cooling liquid, and the system comprises a cooling tank having an open space defined by a bottom wall and side walls, a plurality of arrayed storage sections defined by a plurality of inner partitioning walls provided within the cooling tank to divide the open space, the storage sections being for storing at least one electronic device in each storage section, and an inflow opening and an outflow opening for the cooling liquid that are formed at each of the plurality of storage sections, wherein the inflow opening is formed at a bottom portion or a lateral surface of each storage section, and wherein the outflow opening is formed in the vicinity of the liquid level of the cooling liquid flowing through each storage section. The cooling system further comprises a boiling cooling device thermally connected to at least one heating element possessed by the at least one electronic device and enclosing a first cooling liquid having a boiling point $T_1$ and a first heat exchanger enclosing a third refrigerant having a boiling point $T_3$ ($T_3=T_1$ or $T_3<T_1$) being the same as the boiling point $T_1$ of the first cooling liquid or being lower than the boiling point $T_1$ of the first cooling liquid, wherein each of the plurality of storage sections contains a second cooling liquid having a boiling point $T_2$ ($T_2=T_1$ or $T_2>T_1$) being the same as the boiling point $T_1$ of the first cooling liquid or being higher than the boiling point $T_1$ of the first cooling liquid, wherein the boiling cooling device and the at least one electronic device are immersed in the second cooling liquid within each storage section to be cooled directly, and wherein the first heat exchanger is immersed in the surface layer portion of the second cooling liquid within each storage section.

Advantageous Effects of Invention

According to the cooling system in the present invention, when the first cooling liquid enclosed in the boiling cooling device connected thermally to the heating element vaporizes, the boiling cooling device deprives the heating element of heat locally and powerfully, and at the same time, the second cooling liquid having a boiling point $T_2$ being the same as the boiling point $T_1$ of the first cooling liquid or being higher than the boiling point $T_1$ of the first cooling liquid completely deprives the boiling cooling device of the heat, whereby the electronic device is cooled as a whole. At this time, the second cooling liquid being the same in boiling point as the first cooling liquid or being higher in boiling point than the first cooling liquid effectively and powerfully cools peripheral electronic components mounted on the electronic device. That is, the refrigerant for the secondary cooling (the second cooling liquid) for the boiling cooling of the processor being a primary heat source also operates as an effective primary cooling refrigerant for the peripheral electronic components. Further, because of being immersed in the surface layer portion of the second cooling liquid inside the cooling tank, the first heat exchanger which encloses the third refrigerant having the boiling point $T_3$ ($T_3=T_1$ or $T_3<T_1$) being the same as the boiling point $T_1$ of the first cooling liquid or being lower than the boiling point $T_1$ of the first cooling liquid takes the heat at the surface layer portion of the second cooling liquid away to take the heat outside the cooling tank. In this way, a triple cooling is carried out which includes the local cooling of the primary heat source by the boiling cooling device, the liquid immersion cooling of the boiling cooling device and the whole of the peripheral electronic components by the secondary cooling refrigerant (the second cooling liquid), and the deprivation of heat from the surface layer portion of the secondary cooling refrigerant by the first heat exchanger, and thus, the cooling performance of the electronic device can be remarkably improved. Further, since the cooling liquid being relatively high in boiling point can be used as the second cooling liquid, the second cooling liquid is hard to vaporize, and thus, the cooling tank containing the second cooling liquid can be an open space being non-airtight, so that it is not required to use a sealed structure being complicated and expensive. In addition, because it is sufficient to do nothing but to immerse the first heat exchanger in the surface layer portion of the second cooling liquid, the volume which the structural components occupy within the cooling tank is enough to be small. Accordingly, it can be realized to simplify and downsize the cooling system. Furthermore, in a boiling cooling system in the prior art, mechanisms such as complicated piping, a large-size heat sink and the like are required for cooling a processor being a primary heat source, and the existence of these results in impeding the cooling of peripheral electronic components which have to depend on air cooling. As opposed to such prior art, according to the present invention, the complicated piping and the large-size heat sink become unnecessary to be advantageous in cooling the peripheral electronic components, and in addition, the secondary cooling refrigerant (the second cooling liquid) spreads widely over the whole of the board, so that it becomes possible to cool the peripheral electronic components efficiently. Incidentally, the cooling tank having the "open space" in the present description is to be construed also to encompass a cooling tank having a simple sealed structure of the degree that does not spoil the maintainability of the electronic device. For example, a structure in which the top board is attached through a gasket and the like to be detachable or to be openable and closable can be regarded as the simple sealed structure. Particularly, since the first heat exchanger suffices to be immersed in the surface layer portion of the second cooling liquid, it is possible to make the first heat exchanger held mechanically on the top board.

The foregoing object and advantages and other objects and advantages of the present invention will be further clarified by the description of the following embodiments. However, the embodiments described hereafter are for exemplification purpose and do not intend to limit the present invention to the embodiments.

DESCRIPTION OF EMBODIMENTS

Hereinafter, preferred embodiments of a cooling system according to the present invention will be described in detail with reference to the drawings. In the description of the present embodiments, first of all, with reference to FIG. 1, FIG. 2A, FIG. 2B and FIG. 2C, there will be described as one preferred embodiment the structure of an important portion of a cooling system in which an electronic device mounting as a heating element on a board a processor comprising a die (semiconductor chip) and a heat spreader surrounding the die is housed in a cooling tank to be cooled. Then, with reference to FIG. 3, as the electronic device, one unit only is schematically shown including the board with a plurality of processors mounted thereon, and description will be made regarding the entire construction of the cooling system for cooling the electronic device with the same stored in the cooling tank. Subsequently, as the other preferred embodiment, with reference to FIG. 4 through FIG. 6, the structure of a high-density cooling system will be described which cools electronic devices respectively stored in a plurality of storage sections defined in a cooling tank.

Incidentally, these are for the purpose of exemplifications. The number and the kind of the processors (CPU or GPU) per board are discretionary, the number of units of the electronic devices in the cooling system is also discretionary, and such number or kind does not limit the configuration of the electronic devices in the present invention.

Figure 1:
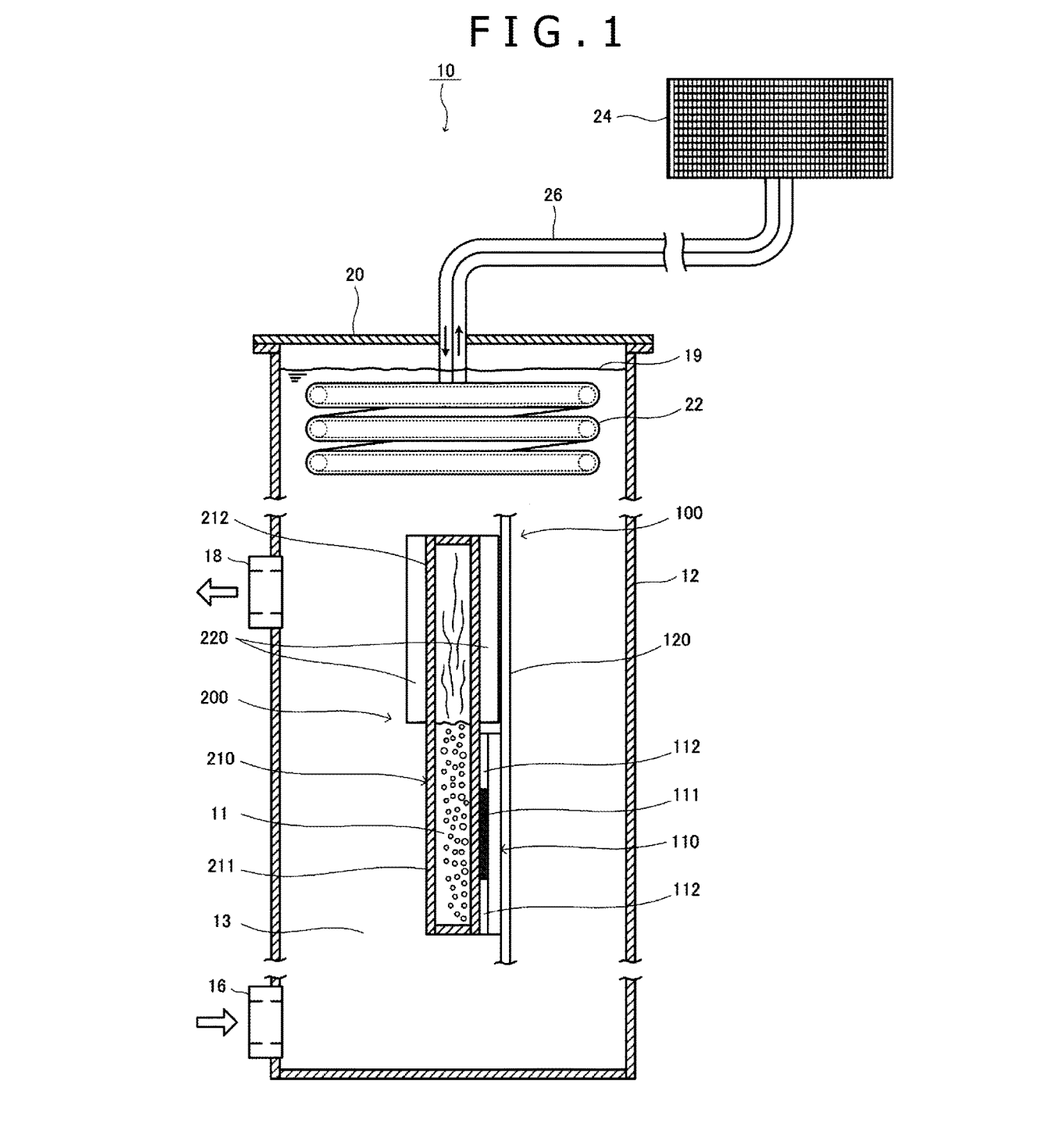
FIG. 1 is a partly-enlarged, longitudinal sectional view showing the structure of an important portion in a cooling system according to one embodiment of the present invention.

Referring to FIG. 1, a cooling system 10 according to one embodiment of the present invention has a cooling tank 12, and the cooling tank 12 contains in an open space a second cooling liquid 13 having a boiling point $T_2$. In the open space of the cooling tank 12, an electronic device 100 mounting a processor 110 as a heating element on a board 120 is stored and is immersed in the second cooling liquid 13. The processor 110 includes a die 111 and a heat spreader 112 surrounding the die. Incidentally, the use of the heat spreader is discretionary and may be omitted. On the board 120 of the electronic device 100, a plurality of other processors and peripheral electronic components are mounted as a matter of course besides the processor 110, but the plurality of these other processors and the electronic components are omitted from illustration. A boiling cooling device 200 is a cooling device connected thermally to the processor 110 as a heating element and encloses a first cooling liquid 11 having a boiling point $T_1$ (provided $T_2=T_1$ or $T_2>T_1$).

Figure 2A:
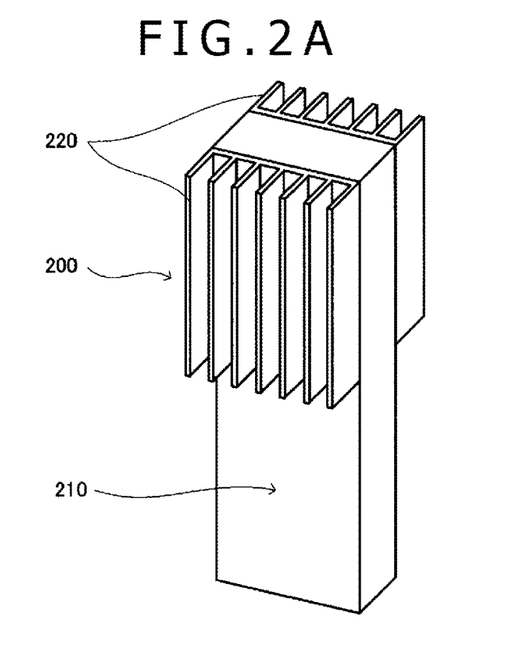
FIG. 2A is a perspective view showing one example of a boiling cooling device.

As shown in FIG. 1 and FIG. 2A, the boiling cooling device 200 has a sealed container 210 with a heat receiving side 211 and a heat radiation side 212 and also has heat radiating members 220 provided on the heat radiation side 212. In the illustrated example, the sealed container 210 takes a thin box shape constructed by six flat boards, so that a space of a rectangular shape in section is defined therein. Incidentally, the external shape and interior structure of the sealed container 210 are discretionary, and thus, the dimensions and the shape may suitably be determined with the area of a heating surface of an object to be cooled and the amount of heat generated taken into consideration. In the present embodiment, for purpose of convenience, the lower half of the box-shape sealed container 210 is called a heat receiving side 211, while the upper half is called a heat radiation side 212. However, attention is drawn to the fact that connected to the heating surface of the processor 110 is only one surface of the lower half of the sealed container 210, as described later. As the material for the sealed container 210, there can be used a metal being excellent in thermal conductivity such as aluminum, copper, silver or the like. However, the material is not limited to these.

The sealed container 210 encloses therein a first cooling liquid 11 of the quantity of the degree to fill the space of the heat receiving side 211. As the first cooling liquid, there can be preferably used a hydrofluoroether (HFE) compound known as brand names of 3M Company: "Novec (trademark of 3M Company; the same applies hereafter) 7000" (boiling point: 34° C.), "Novec 7100" (boiling point: 61° C.), "Novec 7200" (boiling point: 76° C.), and "Novec 7300" (boiling point: 98° C.). However, the first cooling liquid is not limited to any of these. Because it is considered that usually, the operating temperature of the processor is desirable to be controlled at 100° C. or lower, a cooling liquid with a boiling point of 100° C. or lower is desired so that the boiling cooling function of the boiling cooling device 200 is not harmed. Incidentally, a method of enclosing the first cooling liquid within the sealed container 210 will be omitted from detailed description here because a known method is applicable.

On the heat receiving side 211 of the sealed container 210, the back of the box-like sealed container 210 is thermally connected to the heating surface of the processor 110. In this connection, there can be used an adhesive like a metal grease being excellent in thermal conductivity, but the present invention is not limited to such an adhesive. Incidentally, regarding a direction in which the boiling cooling device 200 is connected to the heating surface of the processor, it may suffice that the heat radiation side 212 is located to be higher than the heart receiving side 211 when the boiling cooling device 200 and the electronic device 100 are immersed in the second cooling liquid 13.

On the heat radiation side 212 of the sealed container 210, the box-like sealed container 210 is provided with the heat radiating members (radiating fins) 220 respectively on the front and the back thereof. The heat radiating members 220 can control the heat amount deprived by the second cooling liquid by increasing or decreasing the surface area on the heat radiation side 212. As the material for the heat radiating members 220, the same material as the sealed container 210 is sufficient, and the method of fixing to the sealed container may use a known method such as soldering.

Figure 2B:
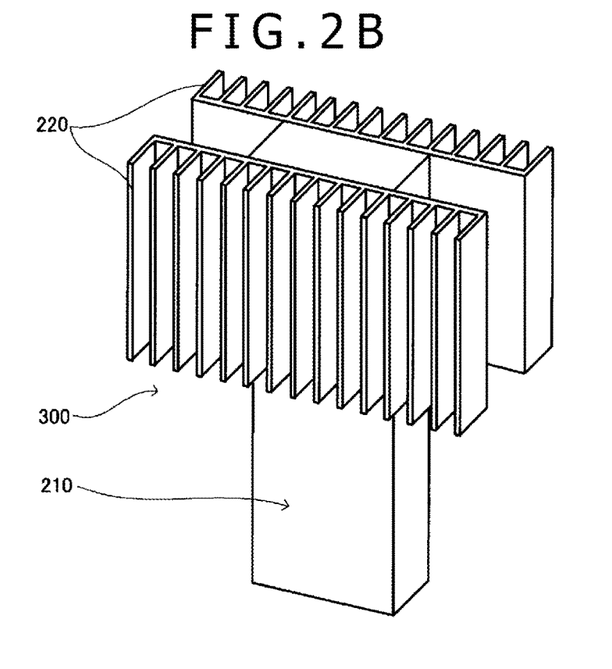
FIG. 2B is a perspective view showing another example of the boiling cooling device.

FIG. 2B shows another example of the boiling cooling device and uses the same reference signs for portions similar to those in FIG. 2A. In the example shown in FIG. 2B, the boiling cooling device 300 has the heat radiating members 220 with the dimension enlarged in the width direction and with the number of fins increased and thus, is increased in heat amount radiated relative to the boiling cooling device 200 shown in FIG. 2A. Conversely, where a future advance in material technology for the sealed container 210 enables a desired cooling performance to be achieved without an increase in surface area by an addition al provision of the heat radiating members 220, such addition al provision of the heat radiating members 220 may be omitted. That is, as shown in another example shown in FIG. 2C, it may be possible to constitute a boiling cooling device 400 by the sealed container 210 only which is not provided with any heat radiating member.

Referring back to FIG. 1, in the cooling tank 12, the second cooling liquid 13 of the quantity sufficient to immerse the whole of the boiling cooling device 200 and the electronic device 100 is contained up to the liquid level 19. As the second cooling liquid, there can preferably be used a fluorine-based inert liquid comprising perfluoride (a perfluorocarbon compound) and known as "Fluorinert (trademark of 3M Company; the same applies hereafter) FC-72" (boiling point: 56° C.), "Fluorinert FC-770" (boiling point: 95° C.), "Fluorinert FC-3283" (boiling point: 128° C.), "Fluorinert FC-40" (boiling point: 155° C.) or "Fluorinert FC-43" (boiling point: 174° C.), the brand names of 3M Company. However, the cooling liquid is not limited to any of these. However, it is important to choose as the second cooling liquid 13 a refrigerant having a boiling point $T_2$ which is the same as the boiling point $T_1$ of the first cooling liquid 11 or is higher than the boiling point $T_1$ of the first cooling liquid 11, according to the present invention. As one example, where "Novec 7000" (boiling point: 34° C.) or "Novec 7100" (boiling point: 61° C.) is used as the first cooling liquid 11, "Fluorinert FC-43" (boiling point: 174° C.) can preferably be used as the second cooling liquid 13.

Paying attention to the point that perfluoride possesses excellent properties such as ozone depletion potential being zero and the like because of being a compound which is high in electric insulation and in heat transfer capability, is inert and high in thermal and chemical stabilities, is incombustible and does not include oxygen, the present inventor completed an invention of a cooling system in which a cooling liquid including such perfluoride as a main component is used as a refrigerant for immerse cooling of high-density electronic devices, and already filed a patent application (Japanese Patent Application NO. 2014-170616). As disclosed in this preceding application, particularly, Fluorinert FC-43 or Fluorinert FC-40, when used as the second cooling liquid, can efficiently cool a plurality of electronic devices set in a high density within a cooling tank of a small volume while greatly reducing the loss attributed to vaporization of the second cooling liquid 13 from the cooling tank having the open space, and therefore, is very advantageous. However, as mentioned already, according to the present invention, limitation is of course not imposed on choosing, for the second cooling liquid 13, either of Fluorinert FC-72, FC-770 and FC-328 as a cooling liquid having the boiling point $T_2$ which is the same as the boiling point $T_1$ of the first cooling liquid 11 or is higher than the boiling point $T_1$ of the first cooling liquid 11.

Incidentally, because Fluorinert FC-43 or FC-40 has a boiling point being 150° C. or higher and has the property of being extremely hard to vaporize, the top board 20 provided at the upper opening of the cooling tank 12 may be attached to the upper opening to be detachable or openable and closable so that the maintenance of the electronic device 100 can be done easily. For example, the top board 20 may be supported to be openable and closable by a hinge portion (not shown) provided at one brim portion of the upper opening of the cooling tank 12. Further, a lateral portion of the cooling tank 12 is provided at a lower portion with an inlet 16 for enabling the second cooling liquid to flow in and is provided at an upper portion with an outlet 18 for enabling the second cooling liquid to flow out. Thus, a configuration is taken so that the electronic device 100 stored in the open space of the cooling tank 12 is immersed in the second cooling liquid 13 circulating in the open space of the cooling tank 12 to be cooled directly.

Referring to FIG. 1, the cooling system 10 according to one embodiment further has a first heat exchanger 22 mechanically held by the top board 20, and the first heat exchanger 22 is immersed in a surface layer portion of the second cooling liquid 13. The method of mechanically holding the first heat exchanger 22 suffices to use, for example, a suspending support member (not shown) secured to the top board 20 but is not limited to this. The first heat exchanger 22 encloses a third refrigerant (not shown) having a boiling point $T_3$ ($T_3=T_1$ or $T_3<T_1$) being the same as the boiling point $T_1$ of the first cooling liquid or being lower than the boiling point $T_1$ of the first cooling liquid. Here, being "enclosed" means that the third refrigerant does not leak to the outside air but does not means that the third refrigerant is restrained from moving from the first heat exchanger to another component portion (for example, to a second heat exchanger referred to later) or form circulating between the first heat exchanger and another component portion. As the third cooling liquid, like the first cooling liquid, there can preferably be used a hydrofluoroether (HFE) compound known as brand names of 3M Company: "Novec 7000" (boiling point: 34° C.), "Novec 7100" (boiling point: 61° C.), "Novec 7200" (boiling point: 76° C.), and "Novec 7300" (boiling point: 98° C.), but the third cooling liquid is not limited to any of these. However, it is important to choose, as the third refrigerant, a refrigerant having the boiling point $T_3$ which is the same as the boiling point $T_1$ of the first cooling liquid 11 or is lower than the boiling point $T_1$ of the first cooling liquid 11, according to the present invention. As one example, where "Novec 7000" (boiling point: 34° C.) is used as the first cooling liquid 11, "Novec 7000" (boiling point: 34° C.) can preferably be used as the third refrigerant. Where "Novec 7100" (boiling point: 61° C.) is used as the first cooling liquid 11, "Novec 7000" (boiling point: 34° C.) or "Novec 7100" (boiling point: 61° C.) can preferably be used as the third refrigerant.

Figure 3:
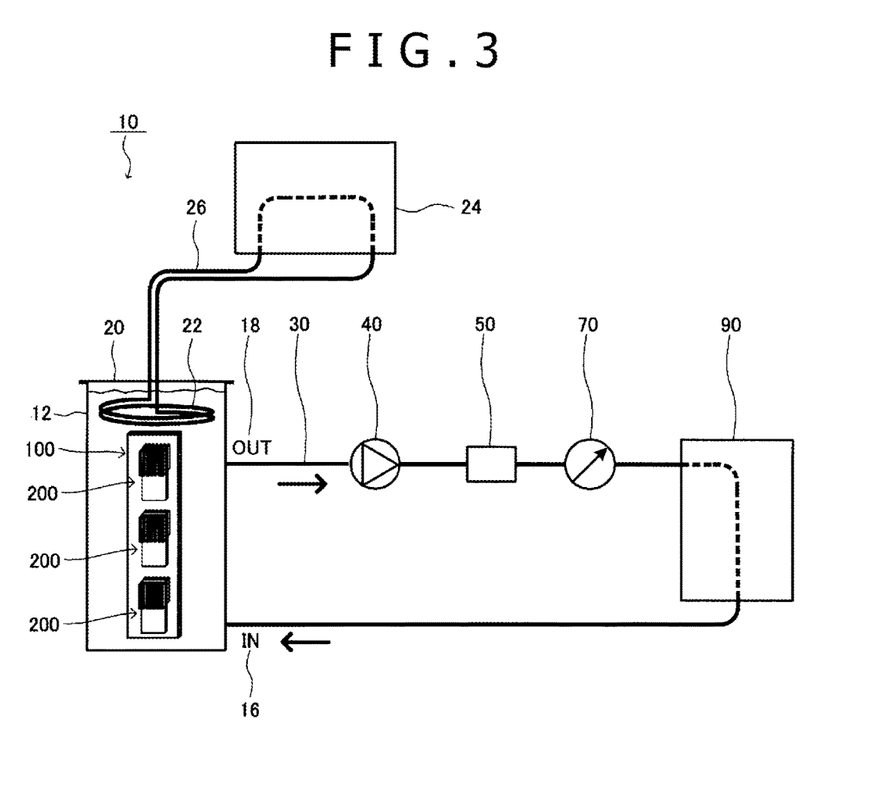
FIG. 3 is a schematic view of a cooling system according to the one embodiment of the present invention.

As shown in FIG. 1 and FIG. 3, the cooling system 10 according to the one embodiment is preferable to be further provided with a second heat exchanger 24 placed outside the cooling tank 12. The first exchanger 22 and the second heat exchanger 24 are connected through a first flow passage 26, and thus, a configuration is taken so that the third refrigerant is movable or circulatable between the first exchanger 22 and the second heat exchanger 24 through the first flow passage 26. In order to be immersed in the surface layer portion of the second cooling liquid 13, a heat exchanger of a thin type is preferable to be used as the first heat exchanger and, for example, may be a heat exchanger comprising a pipe formed to be a coil form, to be spiral or to be meandering. However, this does not mean to limit the structure of the heat exchanger (a plate-type heat exchanger, a plate-fin-type heat exchanger or the like). The second heat exchange 24 suffices to be a heat exchanger for cooling the third refrigerant moving from the first heat exchanger 22 to the second heat exchanger 24 and, for example, may be any of various heat exchangers (radiators or chillers) and refrigerators of a circulation type.

Referring to FIG. 3, the outlet 18 and the inlet 16 of the cooling tank 12 are connected through a second flow passage 30, and the second flow passage 30 is provided therein with a pump 40 for moving the second cooling liquid 13 and a third heat exchanger 90 for cooling the second cooling liquid 13. Incidentally, the second flow passage 30 is also provided therein with a flow rate regulating valve 50 and a flowmeter 70 for regulating the flow rate of the second cooling liquid 13 flowing in the second flow passage 30.

The pump 40 is preferable to have the performance capable of moving a liquid being relatively large in kinematic viscosity (the kinematic viscosity at the room temperature 25° C. exceeds 3 cSt). This is because, for example, where Fluorinert FC-43 or FC-40 is used as the second cooling liquid 13, the kinematic viscosity of FC-43 is the degree of 2.5 to 2.8 cSt, and the kinematic viscosity of FC-40 is the degree of 1.8 to 2.2 cSt. The flow rate regulating valve 50 may be one operated manually or one with a regulating mechanism for maintaining the flow rate constant based on a measured value of the flowmeter 70. Additionally, the third heat exchanger 90 may be any of various heat exchangers (radiators or chillers) and refrigerators of a circulation type.

Next, description will be made regarding the operation of the cooling system 10 according to the one embodiment. When, after the operation of the electronic device 100 is started, the surface temperature of the processor 110 rises to reach a temperature being higher than the boiling point (for example, 34° C. in Novec 7000) of the first cooling liquid 11, the first cooling liquid 11 enclosed in the sealed container 210 of the boiling cooling device 200 becomes bubbles to vaporize from an inner wall surface on the heat receiving side 211 of the sealed container 210. The vaporized first cooling liquid 11 ascends in the space toward the heat radiation side 212 of the sealed container 210. However, the second cooling liquid 13 (for example, Fluorinert FC-43) around the boiling cooling device 200 and the electronic device 100 is kept to be low as, for example, 17° C. to 23° C. in temperature, and thus, the vaporized first cooling liquid 11 is condensed on the inner wall surface of the heat radiation side 212 of the sealed container 210 and descends due to the gravity along the inner wall surface toward the heat receiving side 211 where the first cooling liquid 11 is in a liquid phase state. Such circulation of the refrigerant between a vapor phase and a liquid phase in the boiling cooling device 200 enables the same to deprive the processor 110 of heat locally and powerfully, and at the same time, the second cooling liquid 13 therearound completely deprives the boiling cooling device 200 of the heat completely (mainly through the heat radiating members 220), whereby the electronic device can be cooled as a whole. At this time, the second cooling liquid 13 being high in boiling point effectively and powerfully cools the peripheral electronic components (not shown) mounted on the board 120 of the electronic device 100. That is, the secondary cooling refrigerant (the second cooling liquid 13) for the boiling cooling of the processor 110 being the primary heat source also operates as a primary cooling refrigerant effective to the peripheral electronic components (not shown). Because of being immersed in the surface layer portion of the second cooling liquid 13 within the cooling tank 12, the first heat exchanger 22 enclosing the third refrigerant having the boiling point $T_3$ being the same as the boiling point $T_1$ of the first cooling liquid 11 or being lower than the boiling point $T_1$ of the first cooling liquid deprives the surface layer portion of the second cooling liquid 13 of heat to take the same outside the cooling tank 12. In this way, a triple cooling is performed which includes the local cooling of the main heat source by the boiling cooling device 200, the immerse cooling of the whole of the boiling cooling device 200 and the peripheral electronic components (not shown) by the secondary cooling refrigerant (the second cooling liquid 13), and the deprivation of heat from the surface layer portion of the secondary cooling refrigerant by the first heat exchanger 22, and thus, it is possible to remarkably improve the performance of cooling the electronic device 100.

Further, because the cooling liquid being relatively high in boiling point (for example, Fluorinert FC-43 or FC-40 is 150° C. or higher in boiling point) can be used as the second cooling liquid 13, the second cooling liquid 13 is hard to vaporize, and the cooling tank 12 containing the second cooling liquid 13 can be made as an open space being non-airtight, so that it is not necessary to adopt an airtight or sealed structure which is complicated and expensive. In addition, since the first heat exchanger 22 suffices to be immersed in the surface layer portion of the second cooling liquid 13, the volume occupied by the construction components within the cooling tank 12 is sufficient to be small. Accordingly, it can be realized to simplify and downsize the cooling system. Furthermore, in the boiling cooling system of the prior art, complicated piping, a large-size heat sink and the like are required for cooling a processor being a main heat source, and the existence of these results in obstructing the cooling of peripheral electronic components which have to depend on air cooling. As opposed to the prior art like this, according to the present invention, the complicated piping and the large-size heat sink become unnecessary to be advantageous in cooling the peripheral electronic components (not shown), and the secondary cooling refrigerant (the second cooling liquid 13) widely spreads over the whole of the board 120 of the electronic device 100, so that it becomes possible to cool the peripheral electronic components (not shown) efficiently. Incidentally, in the present embodiment, even where a cooling liquid whose boiling point $T_1$ is the same as the boiling point $T_2$ of the second cooling liquid 13 contained in the cooling tank 12 is used as the first cooling liquid 11 used for the boiling cooling device 200 and/or where a cooling liquid whose boiling point is the same as the boiling point $T_2$ of the second cooling liquid 13 is used as the third refrigerant used for the first heat exchanger 22, it is of course possible to attain the purpose of greatly improving the cooling efficiency in the cooling system of the prior art.

Figure 2C:
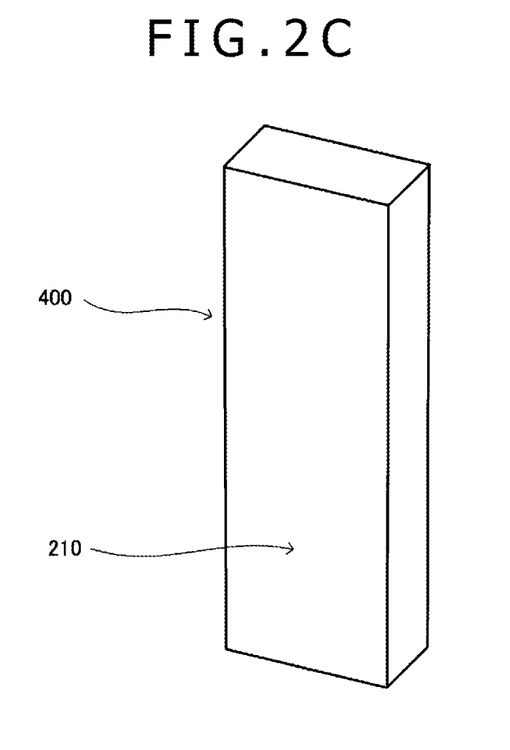
FIG. 2c is a perspective view showing still another example of the boiling cooling device.

In the foregoing, with reference to FIG. 1 through FIG. 3, the cooling system according to the one embodiment has been described taking the example wherein the electronic device of one unit is stored in the cooling tank. This is one that is simplified for describing the important part of the present invention, and the present invention is not limited to the example. It is a matter of course that the present invention is applicable to a high-density cooling system for cooling a plurality of units of electronic devices stored in a cooling tank in a high density. Hereafter, the structure of a high-density cooling system according to the other embodiment of the present invention will be described with reference to FIG. 4 through FIG. 6. Incidentally, the same portions as those in the cooling system shown in FIG. 1 and FIG. 3 will be given the same reference signs and will be omitted from being described in detail.

In the description of the other embodiment, the structure of a high-density cooling system will be described that cools 16 units in total of electronic devices stored in respective storage sections of a cooling tank, each unit including a board mounting a plurality of processors. Incidentally, this is for the purpose of exemplification. The number and the kind of the processors (CPU or GPU) per board are discretionary, the number of units of the electronic devices in the high-density cooling system is also discretionary, and such number or kind does not limit the configuration of the electronic devices in the present invention.

Figure 4:
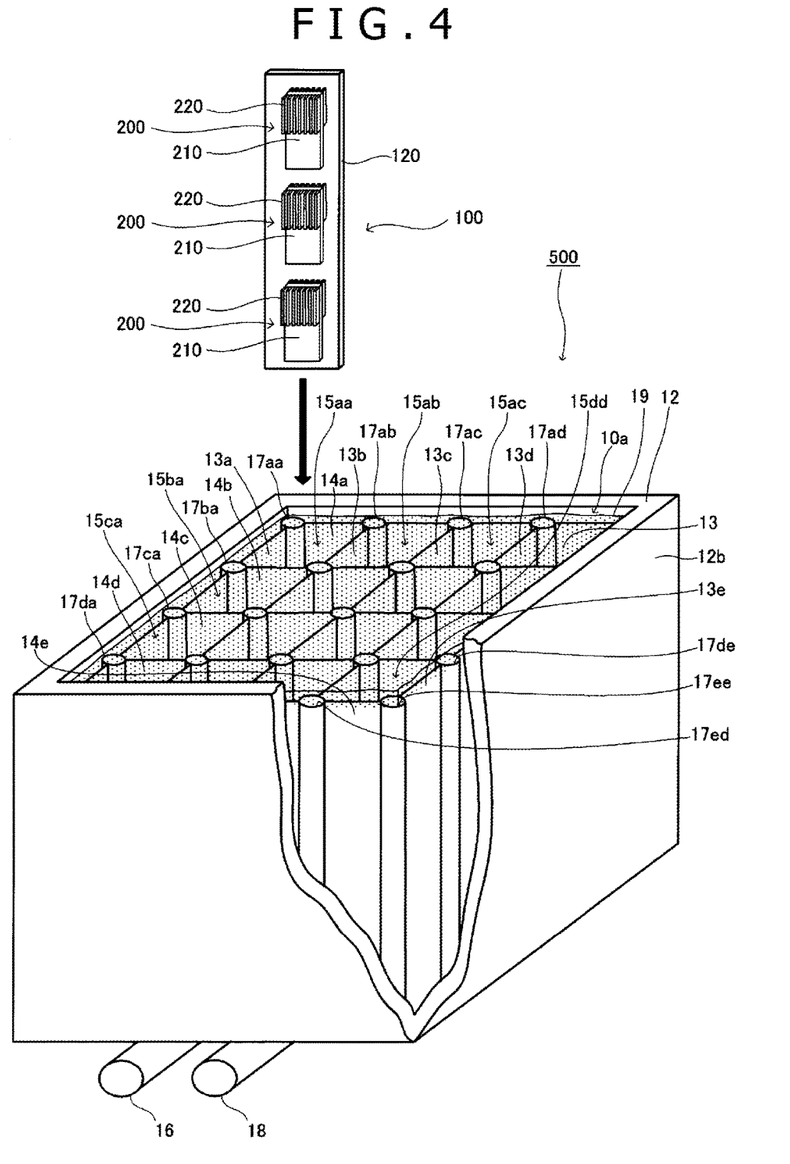
FIG. 4 is a perspective view partly in section showing the structure of a high-density cooling system according to the other embodiment of the present invention.
Figure 5:
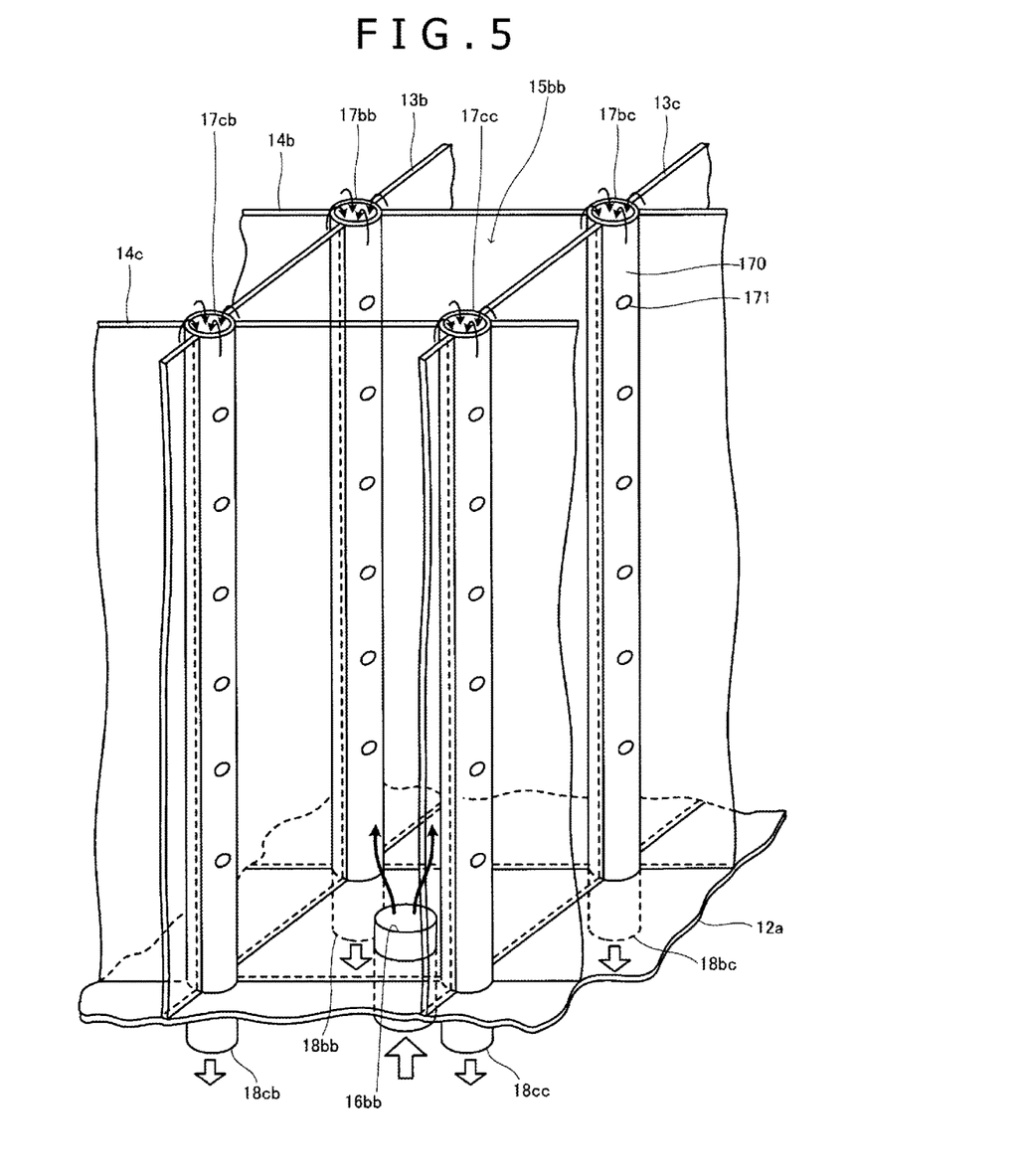
FIG. 5 is a perspective view showing an important portion in the high-density cooling system according to the other embodiment of the present invention.
Figure 6:
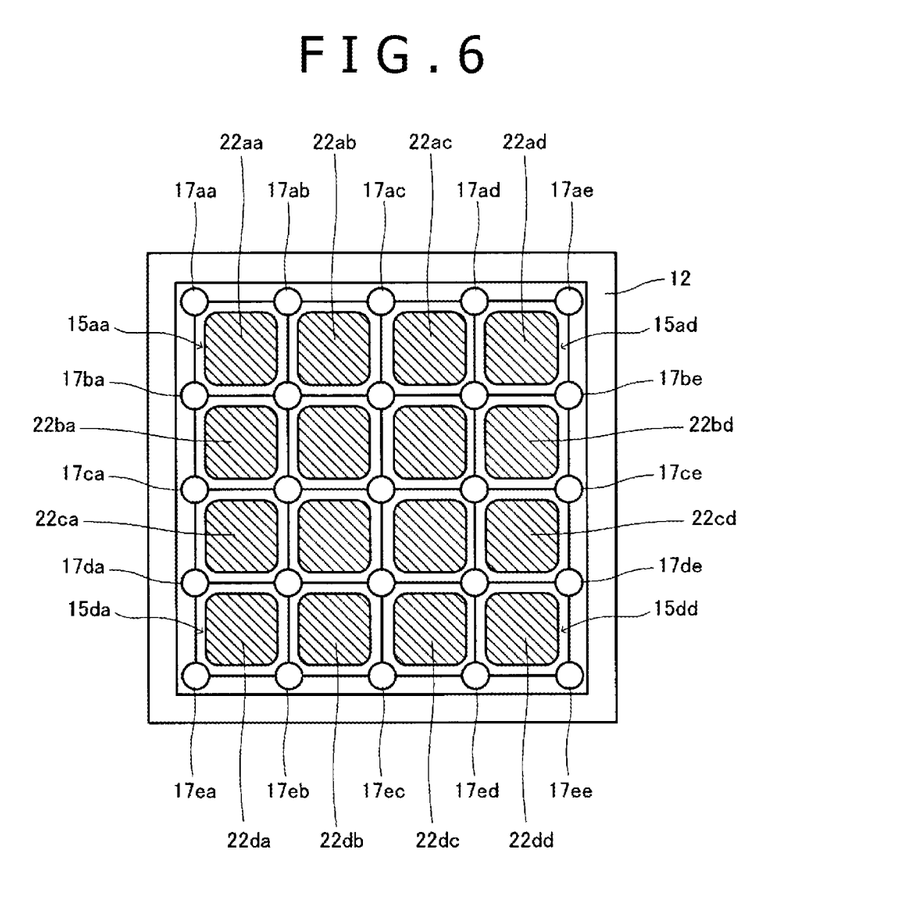
FIG. 6 is a schematic view showing an installation example of first heat exchangers in the high-density cooling system according to the other embodiment of the present invention.

Referring to FIG. 4 through FIG. 6, a cooling system 500 according to the other embodiment of the present invention has a cooling tank 12, and an open space 10*a* is defined by a bottom wall 12*a* and side walls 12*b* of the cooling tank 12. The open space 10*a* is divided equally into sixteen by the provision of inner partitioning walls 13*a*, 13*b*, 13*c*, 13*d*, 13*e* in a length direction and inner partitioning walls 14*a*, 14*b*, 14*c*, 14*d*, 14*e* in a width direction in the cooling tank 12, whereby sixteen arrayed storage sections 15*aa*, 15*ab*, 15*ac*, 5*ad*, 15*ba*, 15*bb*, 15*bc*, 15*bd*, 15*ca*, 15*cb*, 5*cc*, 15*cd*15*da*, 15*db*, 5*dc*, 15*dd* (hereafter, occasionally referred to as "storage sections 15*aa* to 15*dd*" collectively) are defined. Then, at least one electronic device 100 is stored in each storage section. Within the open space 10*a* of the cooling tank 12, a second cooling liquid 13 is contained up to a liquid level 19. The storage sections 15*aa*, 15*ab*, 15*ac*, 5*ad*, 15*ba*, 15*bb*, 15*bc*, 15*bd*, 15*ca*, 15*cb*, 15*cc*, 15*cd*, 15*da*, 15*db*, 15*dc*, 15*dd* are formed at bottom portions with inflow openings 16*aa*, 16*ab*, 16*ac*, 16*ad*, 16*ba*, 16*bb*, 16*bc*, 16*bd*, 16*ca*, 16*cb*, 16*cc*, 16*cd*16*da*, 16*db*, 16*dc*, 16*dd* (hereafter, occasionally referred to as "inflow openings 16*aa* to 16*dd*" collectively) for the second cooling liquid 13, respectively.

Further, in the vicinity of the liquid level 19 of the second cooling liquid 13 flowing through the storage sections 15*aa* to 15*dd*, there are formed outflow openings 17*aa*, 17*ab*, 17*ac*, 17*ad*, 17*ae*, 17*ba*, 17*bb*, 17*bc*, 17*bd*, 17*be*, 17*ca*, 17*cb*, 7*cc*, 17*cd*17*ce*, 17*da*, 17*db*, 17*dc*, 17*dd*, 17*de*, 17*ea*, 17*eb*, 7*ec*, 17*ed*, 17*ee* (hereafter, occasionally referred to as "outflow openings 17*aa* to 17*ee*" collectively).

In the cooling system 500 according to the other embodiment, the outflow openings are formed at positions where the plurality of inner partitioning walls defining respective storage sections intersect with one another, or in the vicinities of such positions. For example, referring to FIG. 4, the storage section 15*aa* is defined by the inner partitioning wall 13*a*, 13*b* in the length direction and the inner partitioning wall 14a, 14b in the width direction, and the outflow openings 17aa, 17ba, 17ab, 17bb are formed to be located respectively at an intersection point of the inner partitioning wall 13a and the inner partitioning wall 14a, an intersection point of the inner partitioning wall 13a and the inner partitioning wall 14b, an intersection point of the inner partitioning wall 13b and the inner partitioning wall 14a, and an intersection point of the inner partitioning wall 13b and the inner partitioning wall 14b. Likewise, referring to FIG. 5, the storage section 15bb is defined by the inner partitioning walls 13b, 13c in the length direction and the inner partitioning walls 14b, 14c in the width direction, and the outflow openings 17bb, 17cb, 7bc, 17cc are formed to be located respectively at an intersection point of the inner partitioning wall 13b and the inner partitioning wall 14b, an intersection point of the inner partitioning wall 13b and the inner partitioning wall 14c, an intersection point of the inner partitioning wall 13c and the inner partitioning wall 14b, and an intersection point of the inner partitioning wall 13c and the inner partitioning wall 14c.

In the cooling system 500 according to the other embodiment, the outflow openings are formed at respective one ends of outflow pipes 170 piercing through the bottom wall 12a of the cooling tank 12 and extending to the vicinity of the liquid level 19. For example, referring to FIG. 5, with respect to the storage section 15bb, the outflow openings 17bb, 17cb, 17bc, 17cc are formed at respective one ends of the outflow pipes 170 which are defined by the inner partitioning walls 13b, 13c in the length direction and the inner partitioning walls 14b, 14c in the width direction and which are located respectively at an intersection point of the inner partitioning wall 13b and the inner partitioning wall 14b, an intersection point of the inner partitioning wall 13b and the inner partitioning wall 14c, an intersection point of the inner partitioning wall c and the inner partitioning wall 14b, and an intersection point of the inner partitioning wall 13c and the inner partitioning wall 14c . Incidentally, respective other ends of the outflow pipes are formed respectively with bottom openings 18aa, 18ab, 18ac, 8ad, 18ae, 8ba, 18bb, 18bc, 18bd, 18be, 18ca, 18cb, 8cc, 18cd, 18ce, 18da, 18db, 8dc, 18dd, 18de, 18ea, 18eb, 8ec, 18ed, 18ee (hereafter, occasionally referred to as "bottom openings 18aa to 18ee " collectively).

Where the outflow openings are defined at the positions where the plurality of inner partitioning walls defining the respective storage sections intersect with one another, an advantage is obtained in that the outflow openings provided for the respective storage sections can be secured to be distributed to four corners of each storage section. For example, at the storage section 15bb, the outflow pipes 170 arranged at the four corners of the section define the outflow openings 17bb, 17bc, 17cb and 17cc. Incidentally, where the outflow openings are defined like this, one outflow opening can become an outflow opening common to the plurality of storage sections. For example, the outflow opening 17bb is a part of the outflow openings for the storage section 15aa and at the same time, is also a part of the outflow openings for the storage sections 15ab, 15ba and 15bb. The same applies also to the outflow openings 17bc, 17cb and 17cc. However, the positions and the number of the outflow pipes provided for each storage section are discretionary, and one or plural outflow pipes may, of course, be provided in the vicinities of the positions where the plurality of inner partitioning walls defining each storage section intersect with one another. Further, the outflow pipes are not required to be integrated with the inner partitioning walls and may be pipes arranged apart from the inner partitioning walls.

Further, as shown in FIG. 5, each outflow pipe 170 may be formed with one or more small holes 171 in the longitudinal direction of the outflow pipe 170. These small holes 171 accelerate the flow of the second cooling liquid 13 remaining in the midway of the storage section in the depth direction. On the other hand, each of the inflow openings 16aa to 16dd is not required to be a cylindrical opening, as illustrated. For example, a header with a plurality of nozzles maybe connected to one end of a cylinder to define the inflow opening by the plurality of nozzles.

In each of the storage sections 15aa to 15dd, an electronic device 100 is stored and immersed in the second cooling liquid 13. The electronic device 100 is the same as the electronic device in the preceding one embodiment and will be omitted herein from being described in detail.

In the cooling tank 12, the second cooling liquid 13 of the quantity sufficient to immerse the whole of the electronic device 100 is contained up to the liquid level 19. The second cooling liquid 13 is the same as the second cooling liquid in the preceding one embodiment and will be omitted herein from being described in detail.

The cooling tank 12 is provided with an inlet 16 for distributing the second cooling liquid 13 through a distribution pipe (not shown) toward the inflow openings 16aa to 16dd provided at the respective storage sections 15aa to 15dd and an outlet 18 for collecting through a collecting pipe (not shown) the second cooling liquids 13 passing through the outflow openings 17aa to 17ee of the respective storage sections 15aa to 15dd.

In order that the second cooling liquid 13 cooled to a predetermined temperature continuously goes through the interiors of the respective storage sections 15aa to 15dd whereby the electronic devices 100 stored in the respective storage sections 15aa to 15dd can be kept at a predetermined temperature or lower during the operations, it is preferable to configure a second flow passage that by a third heat exchanger, cools the second cooling liquid 13 coming out of the outlet 18 of the cooling tank 12 to return the cooled cooling liquid to the inlet 16 of the cooling tank 12. One example of such a flow passage and the attendant facility has already been described in detail with reference to FIG. 3, and thus, the description of those will be omitted here.

Referring to FIG. 6, the cooling system 500 according to the other embodiment has distributed first heat exchangers 22aa, 22ab, 22ac, 22ad, 22ba, 22bb, 22bc, 22bd, 22ca, 22cb, 22cc, 22cd22da, 22db, 22dc and 22dd (hereafter, occasionally referred to as "distributed first heat exchangers 22aa to 22dd " collectively) which each enclose a third refrigerant having a boiling point $T_3$ ($T_1=T_3$ or $T_1>T_3$) being the same as the boiling point $T_1$ of the first cooling liquid 11 or being lower than the boiling point $T_1$ of the first cooling liquid 11. Each of the distributed first heat exchangers 22aa to 22dd is immersed in the surface layer portion of the second cooling liquid 13 in each of the storage sections 15aa to 15dd. Like the first heat exchanger in the one embodiment, each of the distributed first heat exchangers 22aa to 22dd may be mechanically held by a top board (not show). Further, like the example shown in FIG. 1, each of the distributed first heat exchangers 22aa to 22dd may be connected to a second heat exchanger disposed outside the cooling tank 12 through a first flow passage (not shown). This connection may take any of a method of providing second heat exchangers of the same number as the distributed first heat exchangers 22aa to 22dd to make connections therebetween individually, a method of dividing the distributed first heat exchangers 22aa to 22dd into plural groups (e.g., four) each comprising a number (e.g. four) of heat exchangers and of providing second heat exchangers of the number corresponding to the groups to make connections therebetween individually, and a method of connecting one second heat exchanger to the whole of the distributed first heat exchangers 22*aa* to 22*dd*.

Next, description will be made regarding the operation of the cooling system 500 according to the other embodiment. The second cooling liquid 13 entering at the inlet 16 is distributed through a distribution pipe not shown toward the inflow openings 16*aa* to 16*dd* formed at the bottom portions of the storage sections 15*aa* to 15*dd*. The second cooling liquid 13 is forced upward from the inflow openings 16*aa* to 16*dd* and directly cools the boiling cooling device 200 thermally connected to the processor and the peripheral electronic components (not shown) mounted on the board 120 of the electronic device 100. For example, the second cooling liquid 13, when forced upward from the inflow opening 16*bb*, ascends toward the liquid level 19 while taking heat away from the surfaces of the boiling cooling device 200 thermally connected to the processor and the peripheral electronic components (not shown) and further, moves toward the outflow openings 17*bb*, 17*bc*, 17*cb*, 7*cc*. In this case, each volume of the storage sections 15*aa* to 15*dd* is small to be about 1/16 of the volume of the open space 10*a* of the cooling tank 12, and the electronic device 100 stored therein is also small to be about 1/4 wide of the width of the cooling tank 12. Thus, the cooling efficiency of the electronic device 100 by the second cooling liquid 13 is extremely excellent, and the second cooling fluid 13 can effectively be prevented from remaining around the electronic device 100.

Additionally, at each of the storage sections 15*aa* to 15*dd*, each of the distributed first heat exchangers 22*aa* to 22*dd* takes heat away from the surface layer portion of the second cooling liquid 13 to take the heat outside the cooling tank 12. In this way, a triple cooling is performed which includes the local cooling of the main heat source by the boiling cooling device 200, the liquid immerse cooling of the whole of the boiling cooling device 200 and the peripheral electronic components (not shown) by the secondary cooling refrigerant (the second cooling liquid 13), and the deprivation of heat from the surface layer portion of the secondary cooling refrigerant by the distributed first heat exchangers 22*aa* to 22*dd*. The second cooling liquid 13 goes through the outflow openings 17*aa* to 17*ee* located in the vicinity of the surface level 19 in the cooling tank 12, goes down in the outflow pipes 170 to pass through the bottom openings 18*aa* to 18*ee*, and is collected to the outlet 18 through the collecting pipe (not shown).

Although in the foregoing the other embodiment, description has been made of the example wherein the inflow opening is formed at the bottom portion of each storage section, the inflow opening may be formed at a lateral surface of each storage section.

According to the high-density cooling system according to the foregoing the other embodiment, an electronic device of the width (for example, about ½, ⅓ or ¼) being smaller than that in the prior art is stored in the storage section of the volume being about ¼ or the volume being smaller than about ¼ of the volume of the open space of the cooling tank (for example, about ⅑ (in the case of the division of 3 in length by 3 in width), 1/12 (in the case of the division of 3 in length by 4 in width), or 1/16 (in the case of the division of 4 in length by 4 in width) of the open space volume), and the cooling liquid is made to flow individually, so that it becomes possible to cool the plurality of electronic devices individually and efficiently. In other words, in the high-density cooling system according to the foregoing the other embodiment, since the warmed cooling liquid can be made to flow out also from center portions of the cooling tank, it can be avoided that the cooling liquid stays at around the center of the cooling tank to cause the cooling performance to differ independence on the storage positions of the electronic devices as is the case in the prior art wherein warmed cooling liquid is made to flow out from the lateral surface of the cooling tank. Accordingly, the cooling performance of the plurality of electronic devices can be improved and can be stabilized by being prevented from being varied in cooling performance. Further, since the electronic devices stored in the storage sections can be reduced in dimension, it is possible to improve the handling and maintainability of the electronic devices.

Although in the foregoing one embodiment and the foregoing the other embodiment, a configuration is taken so that the second cooling liquid 13 can circulate within the cooling tank 12 since the same has the inlet 16 and the outlet 18 for the second cooling liquid 13, the inlet and the outlet maybe omitted. This is because even in the cooling system without any inlet and outlet, the triple cooling can be performed which includes the local cooling of the main heat source by the boiling cooling device 200, the liquid immerse cooling of the whole of the boiling cooling device 200 and the peripheral electronic components by the secondary cooling refrigerant (the second cooling liquid 13), and the deprivation of heat from the surface layer portion of the secondary cooling refrigerant by the first heat exchanger 22 or the distributed first heat exchangers 22*aa* to 22*dd*. Therefore, the cooling system according to the one embodiment may be altered to the configuration wherein like the cooling tank in the cooling system shown in the other embodiment, the open space is divided by the provision of a plurality of inner partitioning walls within the cooling tank to define a plurality of arrayed storage sections while inflow openings and outflow openings are omitted.

In the foregoing one embodiment and the foregoing the other embodiment, the processor mounted on the board of the electronic device 100 may include either or both of CPU and GPU and further may include a high speed memory, a chip set, a network unit, a PCI express bus, a bus switching unit, an SSD, and power units (ac-dc converter, dc-dc voltage converter and the like). Further, the electronic device 100 may be an electronic device like a server including a blade server, a router, a storage device such as an SSD or the like. However, as mentioned already, in the other embodiment, the electronic device may, of course, be of a smaller width (for example, about ½, ⅓ or ¼) than that of those conventional in the prior art.

Further, although being illustrated as an example taking a thin box shape being vertically long in the foregoing one embodiment and the foregoing the other embodiment, the sealed container 210 in the boiling cooling device 200 may use one placed horizontally and taking a box shape being horizontally long. Further, although the heat receiving side and the heat radiation side of the sealed container 210 have been described with the sealed container 210 of the vertically long box shape dividend for convenience, into the upper half and the lower half, the heat receiving side and the heat radiation side may be made to be common in the vertical direction (provided that a surface side thermally connected to the heating surface of the processor 110 becomes the heat receiving side).

Further, in the foregoing one embodiment and the foregoing the other embodiment, the boiling cooling device 200 has been exemplified as that thermally connected to the processor being the main heating element included in the electronic device 100. However, the present invention does not require the boiling cooling device to be thermally connected individually to any of heating elements included in an electronic device. Further, where an electronic device is an equipment including, for example, a server, a router, a storage device such as a SSD and the like, it is not required that the whole electronic device is thermally connected as one heating element to one or plural boiling cooling devices. It may be discretionally determined by those ordinarily skilled in the art in dependence on the configuration, property, situation in use and the like of an electronic device how a boiling cooling device is thermally connected to which heating element of a plurality of heating elements included in the electronic device, or whether the whole electronic device is thermally connected as one heating element to one or plural boiling cooling devices.

INDUSTRIAL APPLICABILITY

The present invention is widely applicable to cooling systems for cooling electronic devices efficiently.

REFERENCE SIGNS LIST

10, 500: Cooling system
100: Electronic device
110: Processor
111: Die (chip)
112: Heat spreader
120: Board
200, 300, 400: Boiling cooling device
210: Sealed container
211: Heat receiving side
212: Heat radiation side
220: Heat radiating member (radiating fin)
10*a*: Open space
11: First cooling liquid
12: Cooling tank
12*a*: Bottom wall
1213*b*: Side wall
13: Second cooling liquid
13*a*, 13*b*, 13*c*, 13*d*, 13*e*: Inner partitioning wall
14*a*, 14*b*, 14*c*, 14*d*, 14*e*: Inner partitioning wall
15*aa*, 15*ab*, 15*ac*, 5*ad*, 15*ba*, 15*bb*, 15*bc*, 15*bd*, 15*ca*, 15*cb*, 5*cc*, 15*cd*15*da*, 15*db*, 5*dc*, 15*dd*: storage section
16: Inlet
16*aa*, 16*ab*, 16*ac*, 6*ad*, 16*ba*, 16*bb*, 16*bc*, 16*bd*, 16*ca*, 16*cb*, 6*cc*, 16*cd*16*da*, 16*db*, 6*dc*, 16*dd*: inflow opening
17*aa*, 17*ab*, 17*ac*, 7*ad*, 17*ae*, 7*ba*, 17*bb*, 17*bc*, 17*bd*, 17*be*, 17*ca*, 17*cb*, 7*cc*, 17*cd*17*ce*, 17*da*, 17*db*, 7*dc*, 17*dd*, 17*de*, 17*ea*, 17*eb*, 7*ec*, 17*ed*, 17*ee*: outflow opening
170: Outflow pipe
171: Small hole
18: Outlet
18*aa*, 18*ab*, 18*ac*, 8*ad*, 18*ae*, 8*ba*, 18*bb*, 18*bc*, 18*bd*, 18*be*, 18*ca*, 18*cb*, 8*cc*, 18*cd*18*ce*, 18*da*, 18*db*, 8*dc*, 18*dd*, 18*de*, 18*ea*, 18*eb*, 8*ec*, 18*ed*, 18*ee*: Bottom opening
19: Liquid level
20: Top board
22: First heat exchanger
22*aa*, 22*ab*, 22*ac*, 22*ad*, 22*ba*, 22*bb*, 22*bc*, 22*bd*, 22*ca*, 22*cb*, 22*cc*, 22*cd*22*da*, 22*db*, 2*dc*, 22*dd*: Distributed first heat exchanger
24: Second heat exchanger
26: First flow passage
30: Second flow passage
40: pump
50: flow rate regulating valve
70: Flowmeter
90: Third heat exchanger

The invention claimed is:

1. A cooling system for directly cooling an electronic device through immersion in a cooling liquid, the cooling system comprising:
a boiling cooling device thermally connected to at least one heating element possessed by the electronic device and enclosing a first cooling liquid having a boiling point $T_1$;
a cooling tank containing a second cooling liquid having a boiling point $T_2$ ($T_2=T_1$ or $T_2>T_1$) being the same as the boiling point $T_1$ of the first cooling liquid or being higher than the boiling point $T_1$ of the first cooling liquid wherein the boiling cooling device and the electronic device are immersed in the second cooling liquid to be cooled directly; and
a first heat exchanger enclosing a third refrigerant having a boiling point $T_3$ ($T_3=T_1$ or $T_3<T_1$) being the same as the boiling point $T_1$ of the first cooling liquid or being lower than the boiling point $T_1$ of the first cooling liquid and immersed in a surface layer portion of the second cooling liquid in the cooling tank.

2. The cooling system according to claim 1, wherein:
the boiling cooling device is provided with a sealed container having a heat receiving side and a heat radiation side and a heat radiating member provided on the heat radiation side; and
the boiling cooling device is thermally connected to the heating element with the heat radiation side located to be higher than the heat receiving side when the boiling cooling device and the electronic device are immersed in the second cooling liquid.

3. The cooling system according to claim 1, wherein:
the boiling point of the first cooling liquid is 100° C. or lower;
the boiling point of the second cooling liquid is 150° C. or higher ; and
the boiling point of the third refrigerant is 50° C. or lower.

4. The cooling system according to claim 3, wherein the first cooling liquid and/or the third refrigerant includes a fluorocarbon compound as a main component.

5. The cooling system according to claim 3, wherein the second cooling liquid includes perfluoride as a main component.

6. The cooling system according to claim 1, further comprising:
a second heat exchanger disposed outside the cooling tank for cooling the third refrigerant; and
wherein the first heat exchanger and the second heat exchanger are connected through a first flow passage.

7. The cooling system according to claim 1, wherein:
the cooling tank includes a top board attached to an upper opening of the cooling tank to be detachable or to be openable and closable; and
the top board holds the first heat exchanger.

8. The cooling system according to claim 1, wherein:
the cooling tank has an inlet and an outlet for the second cooling liquid;
the inlet and the outlet are connected through a second flow passage being outside the cooling tank; and
the flow passage is provided with at least one pump for moving the second cooling liquid and a third heat exchanger for cooling the second cooling liquid.

9. A cooling system for directly cooling a plurality of electronic devices through immersion into a cooling liquid, the system comprising:
- a cooling tank having an open space defined by a bottom wall and side walls;
- a plurality of arrayed storage sections defined by a plurality of inner partitioning walls provided within the cooling tank to divide the open space, the storage sections being for storing at least one electronic device in each storage section; and
- an inflow opening and an outflow opening for the cooling liquid that are formed at each of the plurality of storage sections;
- wherein the inflow opening is formed at a bottom portion or a lateral surface of each storage section, and the outflow opening is formed in the vicinity of a liquid level of the cooling liquid flowing through each storage section;
- the cooling system further comprising:
- a boiling cooling device thermally connected to at least one heating element possessed by the at least one electronic device and enclosing a first cooling liquid having a boiling point $T_1$; and
- a first heat exchanger enclosing a third refrigerant having a boiling point $T_3$ ($T_3=T_1$ or $T_3<T_1$) being the same as the boiling point $T_1$ of the first cooling liquid or being lower than the boiling point $T_1$ of the first cooling liquid; wherein:
- each of the plurality of storage sections contains a second cooling liquid having a boiling point $T_2$ ($T_2=T_1$ or $T_2>T_1$) being the same as the boiling point $T_1$ of the first cooling liquid or being higher than the boiling point $T_1$ of the first cooling liquid;
- the boiling cooling device and the at least one electronic device are immersed in the second cooling liquid within each storage section to be cooled directly; and
- the first heat exchanger is immersed in a surface layer portion of the second cooling liquid within each storage section.

* * * * *